United States Patent [19]
Hemmie et al.

[11] Patent Number: 5,300,941
[45] Date of Patent: * Apr. 5, 1994

[54] INTEGRATED MMDS ANTENNA AND DOWN CONVERTER

[75] Inventors: Dale L. Hemmie; Marc D. Mills, both of Burlington, Iowa

[73] Assignee: Conifer Corporation, Burlington, Iowa

[ * ] Notice: The portion of the term of this patent subsequent to Apr. 13, 2010 has been disclaimed.

[21] Appl. No.: 4,968
[22] Filed: Jan. 5, 1993

Related U.S. Application Data

[63] Continuation of Ser. No. 707,918, May 30, 1991, Pat. No. 5,202,699.

[51] Int. Cl.⁵ .................. H01Q 19/130; H01Q 9/200
[52] U.S. Cl. ..................................... 343/840; 343/851
[58] Field of Search ............... 343/786, 795, 820–822, 343/840, 878, 880–883, 850–852; 455/280, 288, 293, 333

[56] References Cited

U.S. PATENT DOCUMENTS

| | | | |
|---|---|---|---|
| 3,162,858 | 12/1964 | Cutler | 343/753 |
| 4,290,068 | 9/1981 | Bogner | 343/702 |
| 4,295,143 | 10/1981 | Winegard et al. | 343/840 |
| 4,513,293 | 4/1985 | Stephens | 343/840 |
| 4,595,890 | 6/1986 | Cloutier | 333/21 A |
| 4,791,717 | 12/1988 | Hemmie | 29/600 |
| 4,811,031 | 3/1989 | Maile et al. | 343/840 |
| 4,896,163 | 1/1990 | Shibata et al. | 343/786 |
| 5,008,956 | 4/1991 | Hemmie | 333/203 |
| 5,019,833 | 5/1991 | Nonaka | 343/840 |
| 5,202,699 | 4/1993 | Hemmie et al. | 343/840 |

FOREIGN PATENT DOCUMENTS

| | | | |
|---|---|---|---|
| 1149931 | 7/1983 | Canada | 343/840 |
| 0076642 | 6/1981 | Japan | 343/781 R |
| 0238130 | 10/1986 | Japan | 455/293 |

Primary Examiner—Rolf Hille
Assistant Examiner—Peter Toby Brown
Attorney, Agent, or Firm—Dorr, Carson, Sloan & Peterson

[57] ABSTRACT

An integrated semi-parabolic antenna/down converter MMDS receiving system wherein the support boom of a semi-parabolic antenna contains the down converter electronics. Located at the focal area of the semi-parabolic antenna are a pair of driven feed elements which are directly connected to the printed circuit board carrying the down converter electronics. The down converter is formed in an elongated shape to fit entirely within the formed hollow interior of the support boom. The down converter comprises a first printed circuit board which contains an RF filter located at the input end of the printed circuit board. The input of the RF filter circuit is directly connected to the pair of driven feed elements by soldering the legs of the driven feed elements directly to the input of the RF filter stage on the first printed circuit board. The RF filter is surrounded by an input ground shield which covers the RF filter circuit. The shield is soldered to the top and bottom ground planes of the printed circuit board. At the opposite end of the printed circuit board is an output amplifier whose output is connected to a coax output lead. A coax ground shield engages the opposite end of the first printed circuit board in a perpendicular orientation so as to position the opposite end of the printed circuit board within the hollow interior. The reference oscillator for the down converter is mounted on a second printed circuit board which is spaced from the first printed circuit board and is oriented to have its bottom ground plane facing the bottom ground plane of the first printed circuit board.

8 Claims, 7 Drawing Sheets

INTEGRATED MMDS ANTENNA AND DOWN CONVERTER

This is a continuation of copending U.S. patent application Ser. No. 07/707,918 filed on May 30, 1991, now U.S. Pat. No. 5,202,699.

BACKGROUND OF THE INVENTION

1. Field of the Invention

This invention relates to down converters for semi-parabolic antennas for use in multichannel multipoint distribution systems (MMDS) (also termed 'wireless cable') and, in particular, to integrating the down converter into the feed boom or support for semi-parabolic antennas.

2. Statement of the Problem

Wireless cable is competing with cable to offer programming to the public. Wireless cable utilizes a semi-parabolic reflector which is mounted on the rooftop of a consumer's house. Multiple channels are delivered to this semi-parabolic reflector from a remote location. Conventional microwave semi-parabolic antenna systems utilize an antenna with a separate down converter mounted on the backside with coaxial cable and connectors interconnecting the two elements.

A need exists to integrate the separate down converter into the semi-parabolic reflector in order to reduce wind load of the overall antenna and down converter receiving system, to provide a system which can be installed by the consumer with a minimum of installation time, to eliminate the need for a separate down converter housing (thus reducing the material and labor costs of the system), to eliminate the coaxial cable and connectors interconnecting the antenna and the down converter in order to reduce the signal loss between the antenna and the down converter thereby improving the overall system signal to noise ratio at a significantly lower materials cost, and to improve the impedance matching between the antenna and the down converter which allows for an optimum signal transfer.

3. Results of a Patentability Search

A patentability search was conducted on the teachings of the present invention with respect to a solution to the above problem. The following patents were uncovered in this search:

| Patent No. | Inventor | Issue Date |
| --- | --- | --- |
| 3,162,858 | Cutler | 12-22-64 |
| 4,290,068 | Bogner | 9-15-81 |
| 1,149,931 | Thomas (Canada) | 7-12-83 |

The 1964 patent to Cutler sets forth a ring focus antenna feed for a parabolic dish antenna. Cutler discloses a feed connected to a circular waveguide which in turn is connected to an amplifier. The amplifier and the circular waveguide are contained within a supporting pedestal. The amplifier is then interconnected through a second circular waveguide to the transceiver. The second circular waveguide and the transceiver are located behind the parabolic dish. The amplifier and the first circular waveguide are located in the pedestal which supports the feed.

The 1981 patent to Bogner sets forth a multipoint distribution system (MDS) disk-on-rod type antenna. To the rear of the spaced-apart disk is located a waveguide which includes a cylindrical container having a closed back and sidewalls with an open mouth. Bogner incorporates the down converter into the waveguide in order to reduce wind load and to reduce transmission loss. In implementing the down converter into the waveguide, Bogner requires that it must be contained in less than fifty percent of the volume of the waveguide cavity. Bogner houses his down converter in a separate metal structure within the waveguide. Because the down converter is located in a waveguide, the waveguide must have precise dimensions based upon the wavelength of the signal being sensed. Bogner requires that the metal structure containing the down converter electronics must not touch the sidewalls of the waveguide since to do so would change the waveguide and wavelength. The Bogner approach is critically designed for a frequency of 2153 MHz.

The 1983 Canadian patent to Thomas also relates to an MDS antenna suitable for receiving a single microwave transmission in the 2.15 gigahertz range. Thomas utilizes a semi-parabolic antenna having its feed supported by a hollow tubular support in which Thomas integrates the down converter or a portion of the down converter. Thomas connects the feed elements through a matching network to a coaxial cable which interconnects the matching network to a mixer located within the tubular support. The mixer carries the input RF signal from the feed elements to a signal from the local oscillator and the difference of the input signal (2154.75 MHz) and the local oscillator frequency (2216.0 MHz) is delivered into a set of IF amplifiers whose output is connected to a standard coax cable. The circuit board carrying the electronics contained within the tubular support is grounded to the tubular support by means of an arcuate metal conductor. The conductor electrically connects the printed overlay of the board with the inside metallic surfaces of the support arm. The outer sheath of the coaxial cable which interconnects the mixer with the matching network is also connected to the copper overlay of the circuit board. Likewise, the outer sheath of the coaxial cable interconnecting the outputs of the IF amplifiers and the customer's television set is also grounded to the copper overlay.

Of the three patents found in the search, only the Thomas patent is pertinent. The Bogner approach utilizes a critically designed waveguide having disposed within the waveguide the down converter electronics. The package for the down converter electronics is critically designed and is electrically insulated from the waveguide. Cutler places the amplifier within the feed support but requires a waveguide to extend the signal from the feed to the amplifier. Thomas, like the present invention, utilizes a semi-parabolic antenna and places the down converter or a portion thereof into the tubular support arm which supports the feed. Thomas, while solving the problem with respect to minimizing wind-load and reducing the number of separate parts and components, does not provide a system for providing MMDS programming. Hence, a need still exists when implementing the down converter into the tubular support arm to provide RF filtering in order to minimize IF and image type interference, to provide circuit shielding to prevent unwanted signals from radiating past input filtering, to provide multiple grounding connections between the circuit board and the inside of the support boom to maintain the integrity of RF filtering and shielding, to utilize an RF amplifier stage to establish low noise performance, to provide broad band mixing performance with high signal handling characteristics, to reference a stabilized oscillator, and to provide an integrated down converter/antenna system which is compatible with encryption/addressable systems. The Thomas approach was only concerned with processing a single microwave TV channel and was not concerned with the interference potential of other channels in an MMDS configuration. Furthermore, Thomas did not fully eliminate the coaxial cable interconnections.

4. Solution to the Problem

The present invention provides a solution to the above stated problem, a solution which is not met by the above three patents.

The integrated antenna/down converter of the present invention provides a one-piece concept to MMDS receive antennas. By integrating all the necessary components in the antenna, installation times are kept to a minimum and there is a reduction in inventory parts used by the MMDS operator. The integrated antenna/down converter unit of the present invention can be packaged for consumer installations to allow for more cost savings by the system operator. All necessary cables and connectors are provided for consumer installation. The semi-parabolic reflector of the present invention mounts the down converter in the feed support boom.

The integrated antenna/down converter of the present invention also provides significant RF filtering so as to minimize IF and image type interference. This is accomplished by providing circuit shielding at the input from the feed which prevents signals from radiating past the input filtering and at the output grounding connections exist between the circuit board and the inside of the support boom at the input and output ends. Furthermore, an RF amplifier stage is provided to obtain low noise performance. Broad band mixing performance with high signal handling characteristics are also provided. The circuit of the present invention utilizes a stabilized reference oscillator physically isolated from the main portion of the electronics which also minimizes signal interference. The integrated down converter/antenna system of the present invention is compatible with encryption/addressable systems. Finally, the circuit of the present invention fully eliminates all coaxial cable interconnections between the down converter and the driven feed elements.

SUMMARY OF THE INVENTION

An integrated semi-parabolic antenna/down converter MMDS receiving system is disclosed wherein the support boom of a semi-parabolic antenna contains the down converter electronics. Located at the focal area of the semi-parabolic antenna are a pair of driven feed elements which are directly connected to the printed circuit board carrying the down converter electronics; thereby eliminating a costly coax connection. The support boom of the present invention is square in cross-sectional shape and has a formed hollow interior. The down converter of the present invention is formed in an elongated shape to fit entirely within the formed hollow interior of the support boom.

The down converter comprises a first printed circuit board which contains an RF filter located at the input end of the printed circuit board. The input of the RF filter circuit is directly connected to the pair of driven feed elements by soldering the legs of the driven feed elements directly to the input of the RF filter stage on the first printed circuit board. The RF filter is surrounded by an input ground shield which covers the RF filter circuit. The shield is soldered to the top and bottom ground planes of the printed circuit board. A plurality of ground clips are located on the ground shield so as to firmly abut against the interior sides of the support boom in order to establish an electrical ground connection and to position the printed circuit board within the hollow interior of the support boom. In addition, a ground clip is connected to the bottom ground plane in the area of the RF ground shield which cooperates with the aforementioned ground clips. At the opposite end of the printed circuit board is an output amplifier whose output is connected to a coax output lead. A coax ground shield engages the opposite end of the first printed circuit board in a perpendicular orientation so as to position the opposite end of the printed circuit board within the hollow interior. The coax ground shield is connected to the coax ground and to the top and bottom ground planes of the printed circuit board and functions to minimize interfering radiation. A plurality of ground clips are mounted onto the coax ground shield so as to establish an electrical ground connection to the interior of the support boom and to position the opposite end of the down converter centrally within the hollow interior.

Finally, the reference oscillator for the down converter is mounted on a second printed circuit board which is spaced from the first printed circuit board and is oriented to have its bottom ground plane facing the bottom ground plane of the first printed circuit board. This arrangement substantially minimizes interference between the reference oscillator and the remaining down converter electronics.

SPECIFICATION

1. Overview

Figure 1:
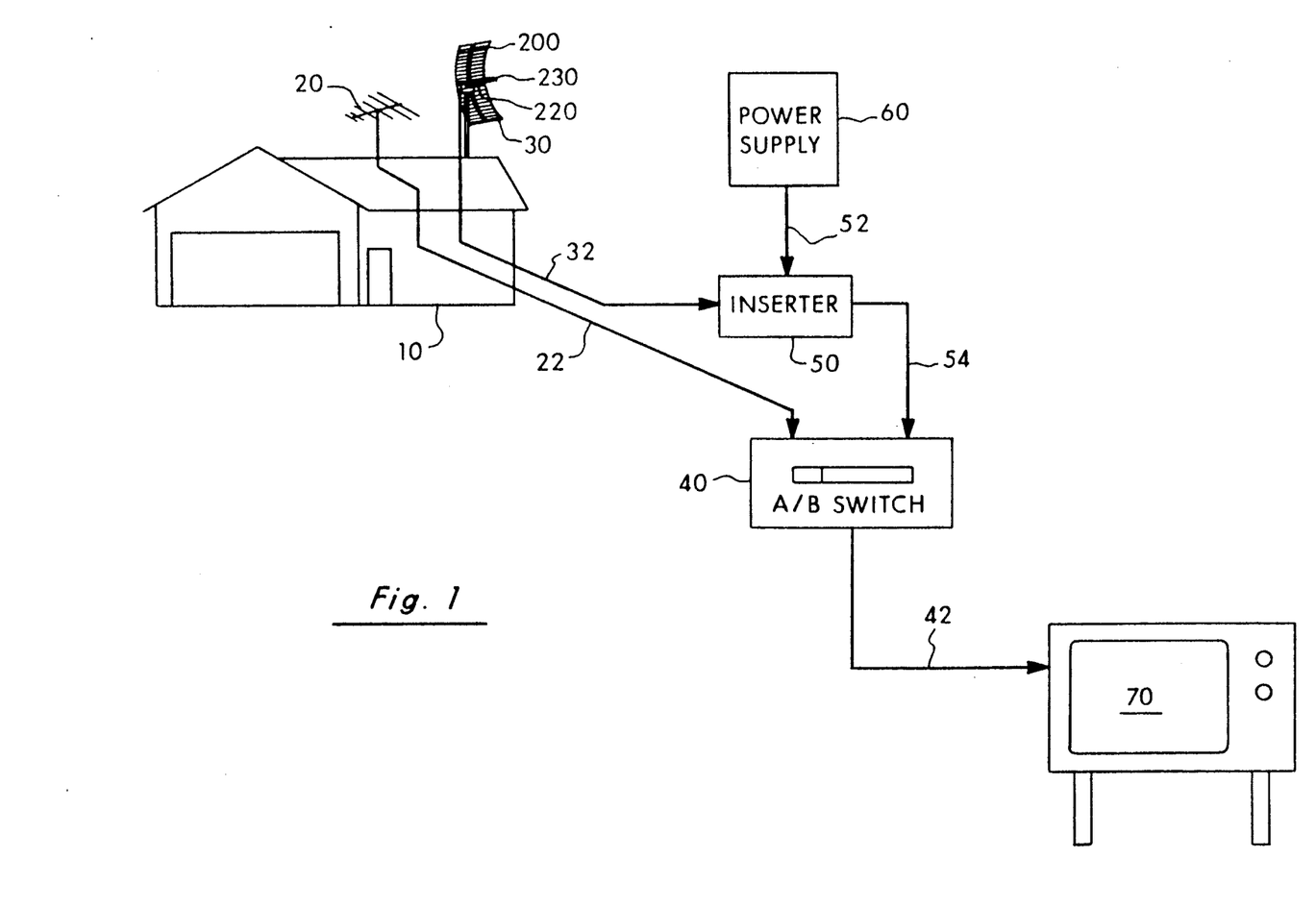
FIG. 1 is an illustration showing the integrated antenna/down converter of the present invention interconnected with a consumer's television system.

In FIG. 1, the environment in which the integrated antenna/down converter of the present invention is utilized is shown. On a consumer's house 10 is mounted a normal antenna 20 and a semi-parabolic MMDS integrated antenna/down converter 30 of the present invention. The conventional antenna 20 is interconnected by means of coaxial cable 22 into a conventional A/B switch 40. The integrated antenna/down converter 30 is also interconnected over coaxial cable 32 to a power inserter 50 which inserts power over lines 52 from a power supply 60. The power inserter 50 is connected by means of coaxial cable 54 to the A/B switch 40. The power inserter 50 is conventional and provides power over coax 32 for powering the down converter portion of the integrated antenna/down converter 30. The A/B switch 40 conventionally selects between the programming available from antenna 20 or from the multiple channels on coax 54 from the MMDS antenna 30. The A/B switch is connected by means of a jumper cable 42 to a consumer's TV 70. The system configuration of FIG. 1 is conventional and is shown to simply illustrate the environment in which the integrated antenna/down converter of the present invention operates. Furthermore, it illustrates how power is conventionally supplied over coax 32 to the integrated antenna/down converter 30 of the present invention.

Figure 2:
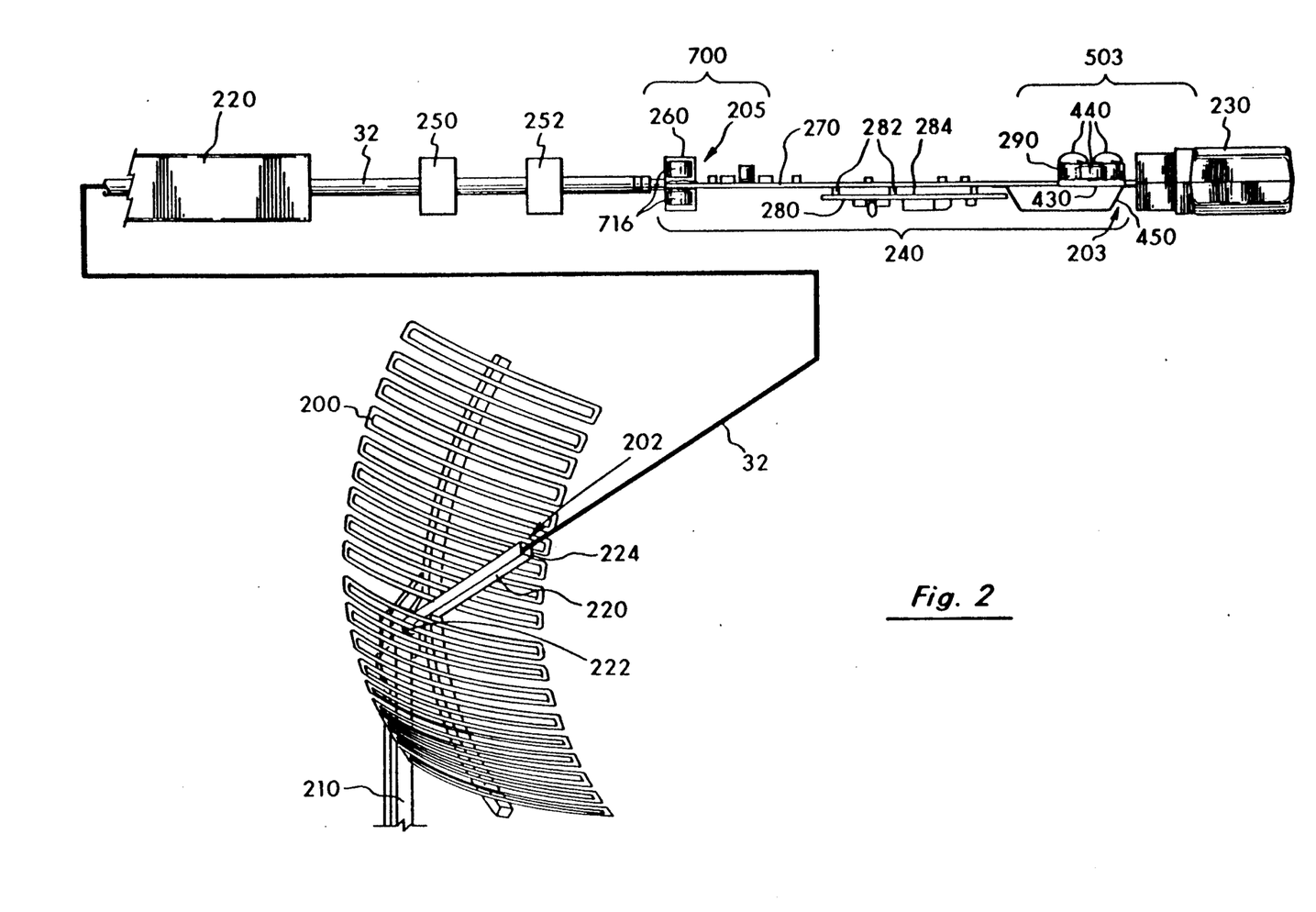
FIG. 2 is an illustration of the various components of the present invention.

In FIG. 2, the integration of the antenna with the down converter of the present invention is shown. A conventional semi-parabolic antenna 200 is mounted to a support post 210. Connected to the antenna 200 is a support boom 220 which, in the preferred embodiment, is a one inch square boom. Any suitable size and suitable geometrical cross-sectional shape (such as rectangular, hexagonal, octagonal, or circular) could also be used. The boom 220 supports a feed housing 230 located in the focal point 202 of the antenna 200. Under the teachings of the present invention, the down converter 240 is located on the interior of the support boom 220. A pair of weatherproof seals 250 and 252 are located in the end 222 of the boom 220 nearest the antenna 200. The down converter 240 is located within the hollow interior of the support boom 220 and the feed 230 is mounted on the end 224 farthest from the antenna 200.

The down converter 240 includes the coax bracket 260, an oscillator board 270 having an input end 203 and an output end 205, a daughter board 280, and a front end filter shield 290. While the present invention integrates the down converter into the hollow interior of the support boom of a semi-parabolic antenna, it is to be expressly understood that the teachings of the present invention find application in full parabolic dish antennas or any suitable microwave antenna. Therefore, the shape of the antenna 200 is not a limiting factor to the teachings contained herein.

2. Down Converter Overview

What follows is a brief description of the electronic components used in the down converter 240 of the present invention.

Figure 3:
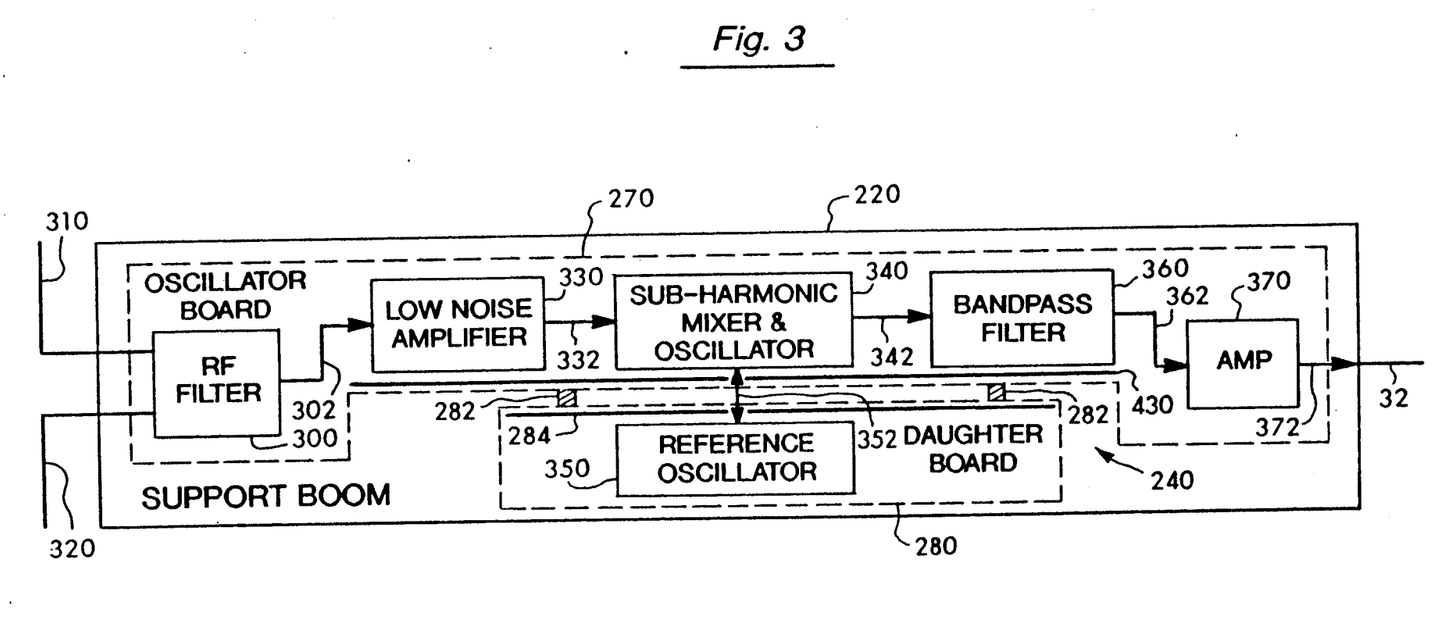
FIG. 3 is a block diagram of the electronic components of the present invention.

In FIG. 3, the block diagram circuit details of the integrated down converter 240 are shown. The oscillator board 270 and the daughter board 280 are located within the support boom 220. As shown in FIG. 2, spacers 282 space the daughter board 280 from the oscillator board 270. The bottom ground plane 430 of the first printed circuit board (i.e., oscillator board) 270 faces the bottom ground plane 284 of the second printed circuit board (i.e., daughter board) 280. The spacing (i.e., caused by spacers 282) and the orientation of the daughter board (i.e., bottom ground planes 430 and 284 facing each other) isolate the electronics on the first and second boards and minimizes any signal interferences between the operation of the two boards.

On the oscillator board 270 is located an RF filter 300 which is directly connected to the feed elements 310 and 320. The RF filter 300 is connected over line 302 to a low noise amplifier 330 which in turn is connected to the sub-harmonic mixer and oscillator 340. The RF filter 300 and the amplifier 330 constitute input circuitry. The sub-harmonic mixer and oscillator 340 receives an error correction signal from the reference oscillator 350 over line 352. The sub-harmonic mixer and oscillator 340 is interconnected to a bandpass filter 360 over lines 342. The bandpass filter 360 is connected to an amplifier 370 over lines 362. The bandpass filter 360 and the amplifier 370 constitute output circuitry. The amplifier 370 is connected to the coax 32. The down converter circuitry utilized to implement the components of FIG. 3 is well known and the details of this circuitry are not necessary for the teachings of the present invention.

From an operational point of view, the RF filter 300 is directly coupled to the feed elements 310 and 320. The details of this direct interconnection will be discussed subsequently. The RF filter provides front end selectivity. The front end selectivity is gained by a combination transmission line and lump component high pass filter. As will be discussed subsequently, the filter is shielded on the top, bottom, and sides to eliminate the potential for IF frequencies passing through the cavity defined by the support boom 220 and entering the active circuits. The RF filter 300 provides bandpass filtering for incoming signals from feed elements 310 and 320 above 2480 MHz. The filter 300 could be the aforesaid high pass design or could be designed as a band-pass filter in the range of about 2480 to 2700 MHz.

Figure 5:
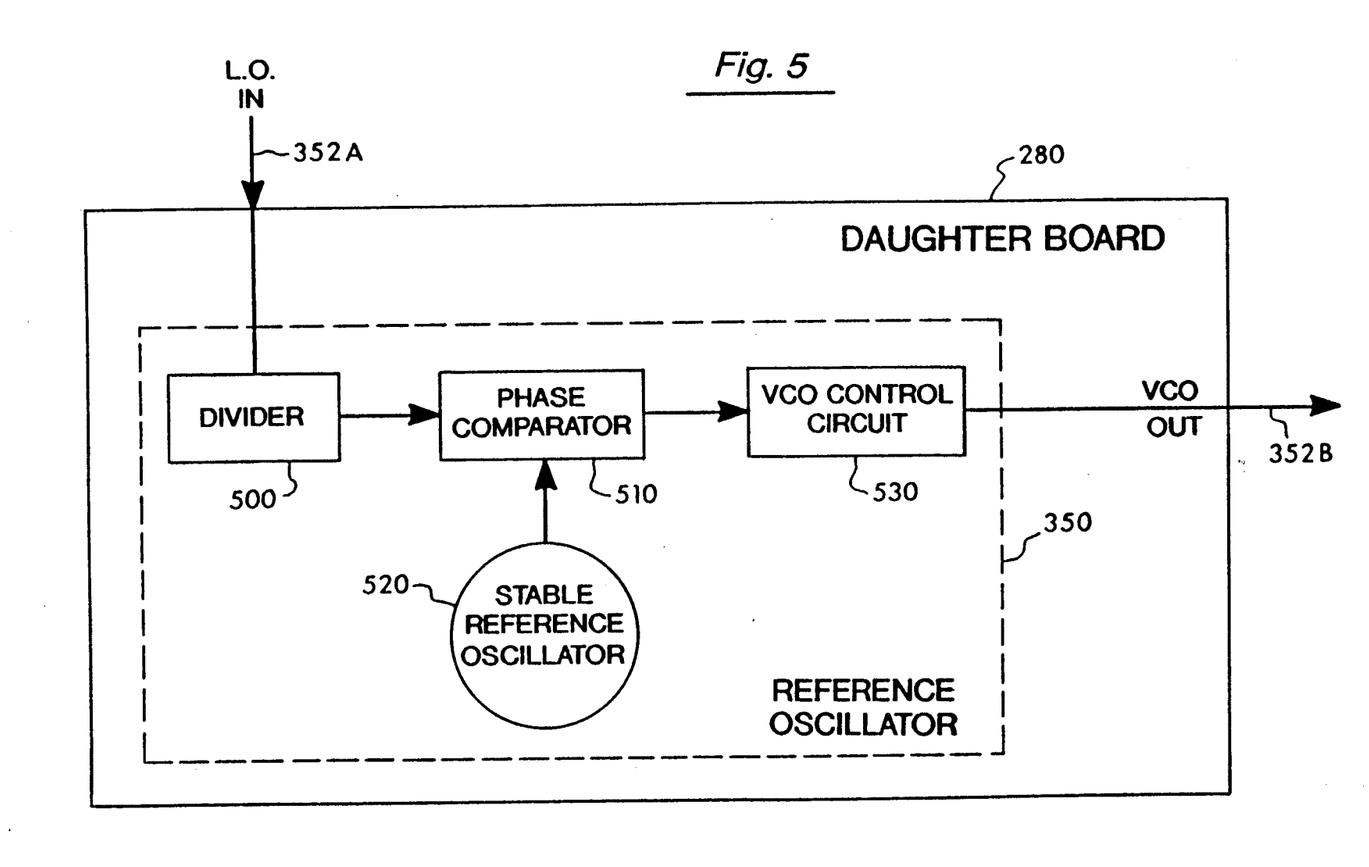
FIG. 5 sets forth the electronic circuitry for the daughter board of the present invention.

The low noise amplifier 330 provides sufficient gain to establish overall noise figure. The output of the low noise amplifier 330 is delivered over lines 332 to the sub-harmonic mixer and oscillator 340. It is to be understood that any suitable mixer design such as an active or single diode design could be utilized. In the preferred embodiment, the oscillator is a single bi-polar transistor in a common collector configuration. Frequency stability is achieved by locking the oscillator to a stable reference oscillator 350 which is delivered over line 352 from the daughter board 280, as shown in FIGS. 3 and 5. The reference oscillator 350 utilizes phase lock loop circuitry and is located on the separate daughter board 280 to minimize the potential for digital noise in the RF circuits 240. In FIG. 5, the daughter board 280 receives the local oscillator signal on line 352A from the sub-harmonic mixer and oscillator 340. This signal is delivered into a divider circuit 500 and is then transferred into the phase comparator 510 for comparison to a reference signal from the stable reference oscillator 520. If any differences are detected, the control circuit 530 adjusts the voltage control output $V_{co}$ and delivers it back over line 352B to oscillator 340. Noise and signal interference are minimized by (1) separating the reference oscillator onto a second printed circuit board, (2) spacing the separate printed circuit board from the oscillator board, and (3) orienting the bottom ground plane of the second printed circuit board to face the bottom ground plane of the oscillator board. The spacing 282 and the orientation of ground planes 430 and 284 are illustrated in FIGS. 2 and 3.

Once the RF signal on lines 332 is mixed to the desired output frequency by circuit 340, the output signal is delivered on lines 342 into the bandpass filter 360. The bandpass filter filters the output signal on lines 342 according to customer requirements but usually in the range of 150-288 MHz.

The filtered signals are delivered on lines 362 to the output amplifier 370 which functions to amplify the signals with approximately 18 dB gain.

Finally, the coax 32 is connected directly to the output of the amplifier 370 and delivered as shown in FIG. 1. It is to be expressly understood that a number of different electronic circuits could be utilized as a down converter for MMDS applications and that the present invention is not to be limited to the application of a particular design.

3. Front End Filter Shield

Figure 4:
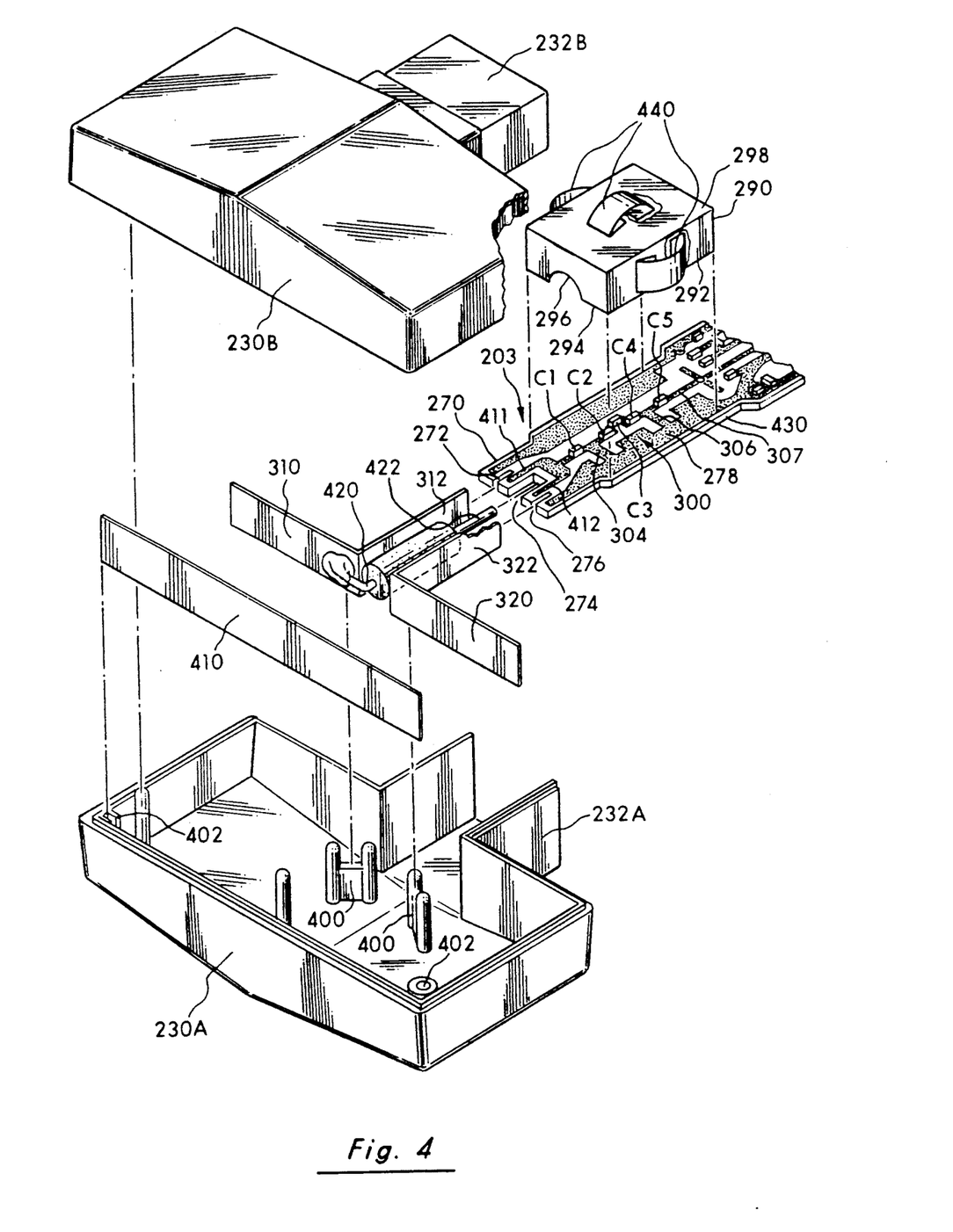
FIG. 4 is an exploded view of the front end of the down converter of the present invention with respect to the drive elements and the housing for the drive elements.

In FIG. 4, the details of the feed housing 230 and the front end filter shield 290 are shown. In FIG. 4, the feed housing 230 consists of a female portion 230A and a male portion 230B. The two portions are designed to fit together to form a weatherproof housing as shown. The driven elements 310 and 320 are held within the housing 230 by pedestals 400. A sub-reflector 410 is held within the housing 230 by slots 402. Also shown in FIG. 4 is the oscillator printed circuit board 270. Printed circuit board 270 at the feed end has three formed slots 272, 274, and 276. Driven element 310 is inserted into slot 272 while driven element 320 is inserted into slot 276. In FIG. 4, connection leg 322 is soldered to top ground plane 278 and bottom ground plane 430 of oscillator board 270. Connection leg 312 of the driven element is soldered to top ground plane 278 and bottom ground plane 430 of oscillator board 270. The balun center conductor 420 has its end 422 soldered 413 to copper pads 411 and 412. It is to be expressly understood that the design of balun 420 could vary and that the teachings of the present invention are not limited to the design illustrated.

As can be observed, the driven elements 310 and 320 are directly soldered to the oscillator board 270 to directly input the RF filter 300. A separate coax is not required. The advantages of this direct connection are (1) the elimination of a weather seal, (2) lower insertion loss, (3) lower cost, and (4) improved impedance matching.

Figure 6:
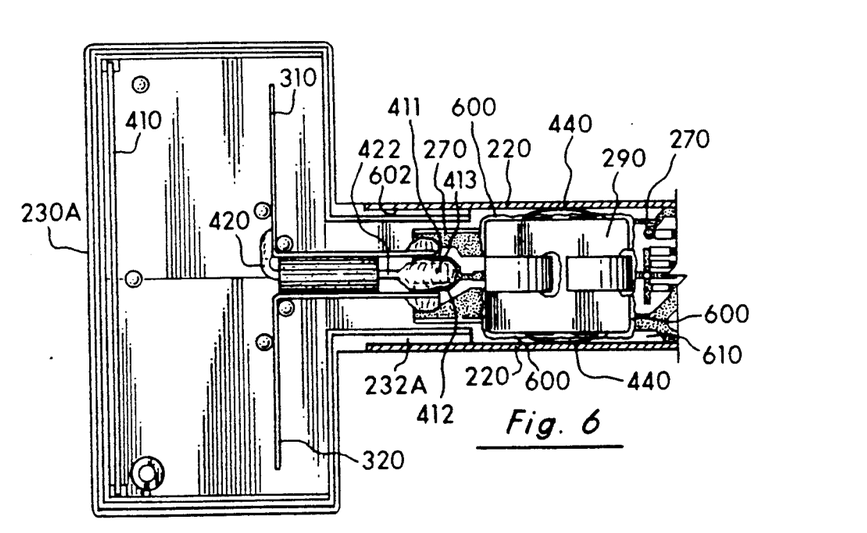
FIG. 6 is a top cutaway planar view of the front the down converter of the present invention as interconnected with the drive elements.
Figure 10:
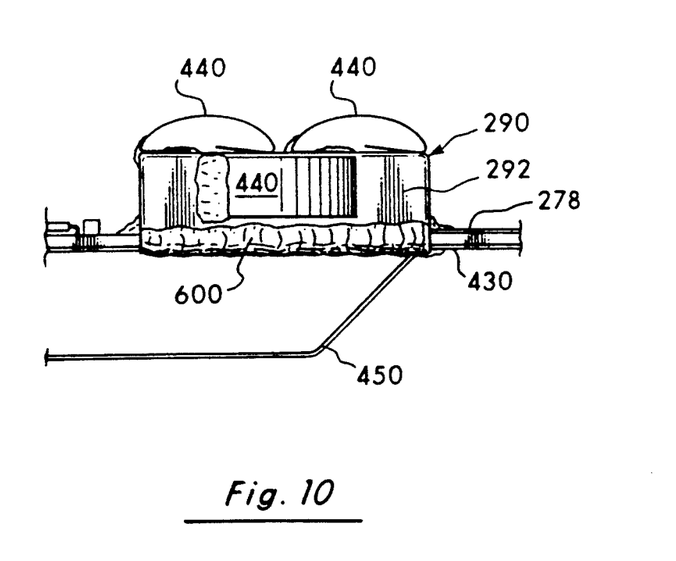
FIG. 10 is a side planar view of the front end filter shield.

As shown in FIGS. 4, 6 and 10, a front end filter shield 290 of solid conductive material (e.g., copper) is designed to be placed over the input RF filter 300. The front end filter shield 290 has the bottoms of its opposing sides 292 and opposing ends 294 soldered 600 to the ground top plane 278 of the oscillator board 270 and to the bottom ground plane 430. Opposing arcuate cutouts 296 are not soldered to the ground plane 278 so as to provide signal pathways. Three ground clips 440 are soldered to the filter shield 290 as shown in FIG. 4 on three sides of the shield 290 (i.e., top 298 and opposing sides 292). The ground clips 440 are designed to firmly abut the inside sidewalls 602 of the support boom 220. As shown in FIG. 2, a fourth ground shield clip 450 is soldered to the bottom ground plane 430 of oscillator board 270 under the shield 290. The four ground clips firmly position and hold the input end 203 of the oscillator board 270, connected to the driven elements 310 and 320, in place within the support boom 220. The four ground clips also provide electrical contact with the interior sidewalls 602 of the metal support boom.

FIGS. 6 and 10 illustrate the front end filter shield 290 soldered 600 to the ground planes 278 and 430 of the oscillator board 270. The end 503 is also shown fully supported and positioned within the interior 610 of the boom 220 by the ground clips 440 and 450. The four ground clips 440 and 450 firmly electrically contact the grounded metallic boom to provide substantial shielding of the input R filter 300 and to prevent unwanted signals from propagating into the hollow interior of the boom and into the downstream circuitry of the down converter. For example, the front end filter shield 290 eliminates the potential for out of band (including IF) frequencies passing through the cavity of the boom 220 and entering the active circuitry of the down converter. The boom 220 is fully grounded to the shield which in turn is grounded to the ground planes 278 and 430.

It is to be expressly understood that a number of different configurations for designing the shield 290 of the present invention could be utilized.

4. Coax Bracket

Figure 7:
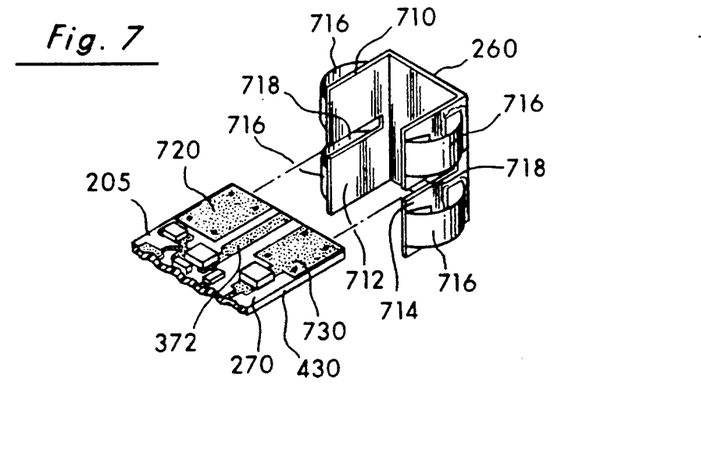
FIG. 7 is a perspective view of the output end of the down converter of the present invention.
Figure 8:
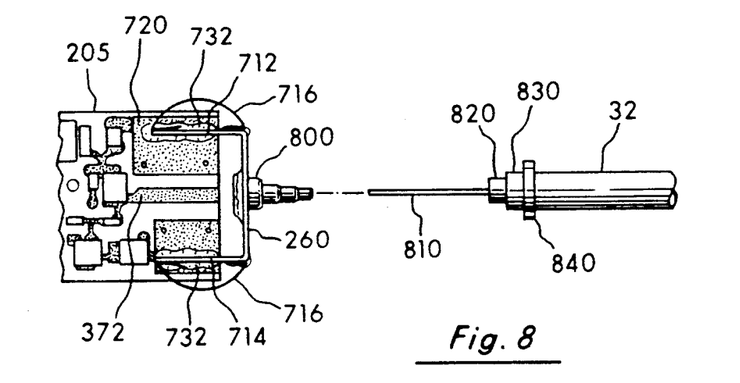
FIG. 8 is a top planar view showing the connection of the coax bracket of the present invention connected to the output end of the down converter of the present invention.
Figure 9:
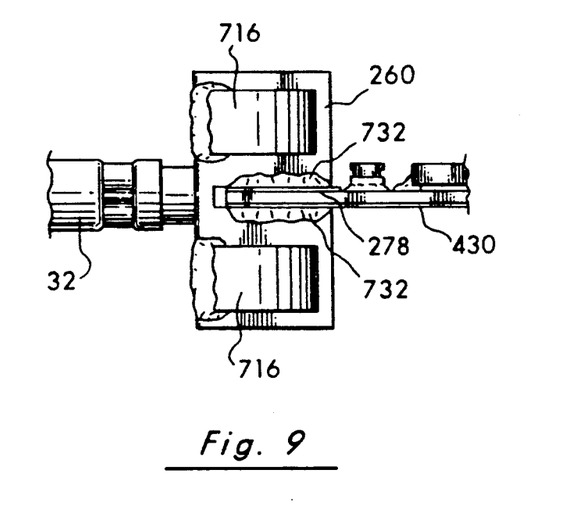
FIG. 9 is a side planar view of the coax ground shield of FIG. 8.

In FIGS. 7-9, the output end 205 of the oscillator board 270 is shown interconnected to a coax bracket 710. The coax bracket 710 formed of solid conductive material (e.g., copper) is designed to be soldered to the output end 205 of the oscillator board 270. The end 205 of the oscillator board has two opposing ground pads 720 and 730 with the output signal lead 372 disposed there between. Lead 372 is connected to the output of amplifier 370. The coax bracket 710 has two legs 712 and 714. On the external opposing sides of each leg, 712 and 714, are soldered two ground clips 716. Each leg 712 and 714 has a formed slot 718 which is designed to slip over end 700. As shown in FIG. 9, legs 712 and 714 are soldered 732 on both sides of the leg 712 and 714 to the top ground pads 720 and 730 and to the bottom ground plane 430. In other words, the upper and lower edges of the slots 718 are soldered on both sides 278 and 430 of the ground plane. This provides a solid electrical ground connection.

As shown in FIGS. 8 and 9, an innerbarrel 800 is soldered to the coax bracket 710. The coax 32 has its center conductor 810 exposed with approximately ¼ inch of the center insulation 820 exposed. The center conductor 810 is mounted through the innerbarrel 800 and the center conductor 810 is soldered to the strip 372. The ground sheath 830 of coax 32 is crimped to the innerbarrel 800. Crimp ring 840 is used to accomplish this. In this fashion, the ground sheath 830 is fully grounded to the coax bracket 710 which in turn is fully grounded to the ground plane of the circuit board 700 to prevent unwanted signals from entering the boom via the coax or the end of the boom nearest the antenna. The ground clips 716 center the end 205 of the oscillator board within the hollow interior of boom 220 in a fashion set forth in FIG. 6. The ground clips 716 also fully ground the end 700 of the board 270 to the internal sides of the support boom 220.

It is clear that the down converter circuitry is fully integrated into the boom. In comparison to standard separate down converters, the housing for the down converter is eliminated as well as the windload associated therewith. The coax connects directly with the coax shield at a point which is fully grounded.

It is to be expressly understood that the claimed invention is not to be limited to the description of the preferred embodiment but encompasses other modifications and alterations within the scope and spirit of the inventive concept.

We claim:

1. An integrated semi-parabolic antenna/down converter MMDS receiving system for receiving comprising:
   a semi-parabolic antenna, a pair of driven feed elements, a support boom formed of conductive material connected to said semi-parabolic antenna for holding said driven feed elements in the focal area of said semi-parabolic antenna, said support boom having a formed hollow interior, a down converter formed in an elongated shape to fit entirely within said formed hollow interior of said support boom, said down converter at least comprising:

(a) a first printed circuit board, said first printed circuit board having a top ground plane, a bottom round plane, and an input end and an output end, (b) an RF filter having an input located on the input end of said first printed circuit board, the input of said RF filter electrically coupled to said driven feed elements, (c) an RF filter shield covering said RF filter and electrically connected to at least said top ground plane of said first printed circuit board, said RF filter shield having a first RF filter shield grounding means located thereon so as to abut against the formed hollow interior of said support boom in order to (1) establish an electrical ground connection therewith and (2) position said first printed circuit board within said hollow interior, (d) said first printed circuit board having a second RF filter shield grounding means connected to said bottom ground plane so as to abut against the formed hollow interior of said support boom in order to (1) establish a ground connection to said conductive material of said formed hollow interior of said support boom and (2) position said first printed circuit board within said hollow formed interior, (e) a second printed circuit board connected in spaced relation to said first printed circuit board, said second printed circuit board having a top ground plane and a bottom ground plane, said second printed circuit board having placed on said top ground plane a reference oscillator, said second printed circuit board having its bottom ground plane oriented to face the bottom ground plane of said first printed circuit board, (f) an output amplifier on the output end of said first printed circuit board, a coax ground shield engaging said first printed circuit board, said coax ground shield electrically connected to at least said top ground plane of said first printed circuit board so as to minimize interfering radiation, said coax ground shield having:

(i) coax shield grounding means on the sides of said coax ground shield so as to (1) establish an electrical ground connection to said conductive material of said support boom and (2) position said output end of said down converter within said formed hollow interior, (ii) means connected to said output amplifier for providing a coaxial connection, a coaxial cable connected to said coaxial connection.

2. The system of claim 1 wherein said support boom is formed in a square cross-sectional shape.

3. The system of claim 1 wherein said RF filter shield is formed from solid conductive material.

4. The system of claim 1 wherein said coax ground shield is formed from solid conductive material.

5. An integrated semi-parabolic antenna/down converter MMDS receiving system comprising:

a semi-parabolic antenna, a pair of driven feed elements, a support boom formed of conductive material connected to said semi-parabolic antenna for holding said driven feed elements in the focal area of said semi-parabolic antenna, said support boom having a formed hollow interior, a down converter formed in an elongated shape to fit entirely within said formed hollow interior of said support boom, said down converter at least comprising:

(a) a printed circuit board, said printed circuit board having a bottom ground plane, said printed circuit board having an input end, (b) an RF filter located on said input end of said printed circuit board, said RF filter having an input end, the input end of said RF filter being electrically coupled to said driven feed elements, (c) an RF filter shield covering said RF filter and electrically connected to at least said bottom ground plane of said printed circuit board, said RF filter shield having a plurality of first RF filter shield grounding means located thereon so as to abut against the formed hollow interior of said conductive material of said support boom in order to (1) establish an electrical ground connection therewith and (2) position said input end of said printed circuit board within said formed hollow interior, and (d) said first printed circuit board having a second RF filter shield grounding means connected to said bottom ground plane so as to abut against the formed hollow interior of said support boom in order to (1) establish a ground connection to said conductive material of said formed hollow interior of said support boom and (2) position said first printed circuit board within said hollow formed interior.

6. The system of claim 5 wherein said support boom is formed in a square cross-sectional shape.

7. The system of claim 5 wherein said RF filter shield is formed from solid conductive material.

8. The system of claim 5 wherein each of said driven feed elements has a connection leg and wherein the input end of said RF filter being directly connected to said driven feed elements by soldering said connection legs of said driven feed elements directly to said RF filter on said printed circuit board.

* * * * *

UNITED STATES PATENT AND TRADEMARK OFFICE
CERTIFICATE OF CORRECTION

PATENT NO. : 5,300,941
DATED : April 5, 1994
INVENTOR(S) : Hemmie et al.

It is certified that error appears in the above-indentified patent and that said Letters Patent is hereby corrected as shown below:

```
At column 1, line 37, before "thereby" insert --(--
At column 1, line 39, after "cost" insert --)--
At column 3, line 31, between "output" and "grounding"
    insert --. Multiple--
At column 3, line 55, delete ";" and insert --,--

At column 7, line 48, delete "ground top" and insert
    --top ground--
At column 8, line 3, delete "R" and insert --RF--
At column 8, line 29, delete "leg" and insert --legs--
At column 8, line 45, delete "700"
At column 9, line 13, delete "round" and insert --ground--
```

Signed and Sealed this

Thirteenth Day of December, 1994

Attest:

BRUCE LEHMAN

*Attesting Officer*  *Commissioner of Patents and Trademarks*